(12) United States Patent
Wu et al.

(10) Patent No.: US 9,276,601 B2
(45) Date of Patent: Mar. 1, 2016

(54) CONVERTING CIRCUIT WITH CONTROL CIRCUIT TO DETECT SIGNALS INPUT INTO THE CONVERTING CIRCUIT, AND COMMUNICATION DEVICE

(71) Applicant: Spreadtrum Communications (Shanghai) Co., Ltd., Shanghai (CN)

(72) Inventors: Jiangang Wu, Shanghai (CN); Haifeng Shen, Shanghai (CN); Jiaqing Wang, Shanghai (CN)

(73) Assignee: SPREADTRUM COMMUNICATIONS (SHANGHAI) CO., LTD. (CN)

( * ) Notice: Subject to any disclaimer, the term of this patent is extended or adjusted under 35 U.S.C. 154(b) by 0 days.

(21) Appl. No.: 14/462,961

(22) Filed: Aug. 19, 2014

(65) Prior Publication Data
US 2015/0145708 A1    May 28, 2015

(30) Foreign Application Priority Data

Nov. 27, 2013    (CN) .......................... 2013 1 0636719

(51) Int. Cl.
*H03M 1/06*    (2006.01)
*H03M 1/46*    (2006.01)
*H03M 1/02*    (2006.01)

(52) U.S. Cl.
CPC .............. *H03M 1/462* (2013.01); *H03M 1/02* (2013.01)

(58) Field of Classification Search
CPC ..................................................... H03M 1/462
USPC .......... 341/155, 163, 161, 144, 122, 118, 120
See application file for complete search history.

(56) References Cited

U.S. PATENT DOCUMENTS

| | | | |
|---|---|---|---|
| 5,144,310 A * | 9/1992 | Sato ............................. | 341/161 |
| 5,331,321 A * | 7/1994 | Mannonen .................... | 341/110 |
| 7,724,174 B2 * | 5/2010 | Chang et al. .................. | 341/163 |
| 8,669,897 B1 * | 3/2014 | Chen et al. .................... | 341/161 |
| 8,816,888 B2 * | 8/2014 | Kumakura .................... | 341/122 |
| 8,830,106 B2 * | 9/2014 | Dasgupta et al. ............. | 341/155 |
| 2011/0043400 A1 * | 2/2011 | Sawai ............................ | 341/161 |

* cited by examiner

*Primary Examiner* — Peguy Jean Pierre
(74) *Attorney, Agent, or Firm* — Cantor Colburn LLP

(57) ABSTRACT

A converting circuit and a communication device are provided. The converting circuit includes: a sample hold circuit for receiving an analog signal; a Digital to Analog Converter (DAC); a comparator being connected with an output end of the sample hold circuit and an output end of the DAC; and a control circuit being connected with an output end of the comparator, wherein when the sample hold circuit receives an analog signal, the control circuit controls the sample hold circuit and the comparator to work, controls an output of the DAC based on an output of the comparator, and outputs a corresponding digital signal; and when the control circuit detects a digital signal is input, the control circuit controls the DAC to convert the digital signal into an corresponding analog signal and output the corresponding analog signal. The converting circuit can reduce chip area and chip cost.

16 Claims, 2 Drawing Sheets

CONVERTING CIRCUIT WITH CONTROL CIRCUIT TO DETECT SIGNALS INPUT INTO THE CONVERTING CIRCUIT, AND COMMUNICATION DEVICE

CROSS-REFERENCE TO RELATED APPLICATIONS

The present application claims priority to Chinese patent application No. 201310636719.X, filed on Nov. 27, 2013, and entitled "CONVERTING CIRCUIT AND COMMUNICATION DEVICE", the entire disclosure of which is incorporated herein by reference.

TECHNICAL FIELD

The present disclosure generally relates to communication technology, and more particularly, to a converting circuit and a communication device.

BACKGROUND

In most communication systems, an Analog to Digital Converter (ADC) is usually provided in a downlink. The ADC can convert analog signals into digital signals which are suitable for computer processing. Correspondingly, a Digital to Analog Converter (DAC) is provided in an uplink of the communication system. The DAC can in turn convert digital signals into analog signals.

Successive Approximation type Analog to Digital Converter (SAR ADC) is a widely used converter. The SAR ADC includes a DAC and a control circuit, where the DAC built in the SAR ADC can calibrate an output of the SAR ADC under control of the control circuit. Therefore, in an application of the SAR ADC, two DACs are configured in both of the uplink and the downlink of the communication system, which increases chip area of the converting circuit and chip cost.

SUMMARY

Embodiments of the present disclosure provide a converting circuit and a communication device to reduce chip area and chip cost of conventional converting circuits.

In an embodiment, a converting circuit is provided. The converting circuit may include: a sample hold circuit for receiving an analog signal; a Digital to Analog Converter (DAC); a comparator being connected with an output end of the sample hold circuit and an output end of the DAC; and a control circuit being connected with an output end of the comparator, wherein when the sample hold circuit receives an analog signal, the control circuit controls the sample hold circuit and the comparator to work, controls an output of the DAC based on an output of the comparator, and outputs a corresponding digital signal; and when the control circuit detects a digital signal is input, the control circuit controls the DAC to convert the digital signal into an corresponding analog signal and output the corresponding analog signal.

In some embodiments, the control circuit may include: a first register for storing an output signal of the comparator; a second register for storing the digital signal; and a path controller for controlling the DAC based on a value of the first register or a value of the second register.

In some embodiments, the path controller may adjust a value of an output voltage of the DAC based on the value of the first register, so that the output voltage of the DAC successively approximates an output of the sample hold circuit.

In some embodiments, the path controller may use a bisection method to adjust the value of the output voltage of the DAC.

In some embodiments, the first register and the second register may have the same storable bits.

In some embodiments, the path controller may control the DAC to convert the digital signal based on the value of the second register, and the DAC outputs the converted signal.

In some embodiments, under control of the control circuit, the sample hold circuit may sample the input analog signal, and output a voltage value of the sampled analog signal.

In some embodiments, under control of the control circuit, the comparator may compare the voltage value of the sampled signal output by the sample hold circuit, with the output voltage value output by the DAC.

In some embodiments, when the output voltage value of the DAC is less than the voltage value of the sampled signal, the comparator outputs a logic low level; and when the output voltage value of the DAC is greater than the voltage value of the sampled signal, the comparator outputs a logic high level.

Correspondingly, a communication device is provided according to one embodiment. The communication device may includes the converting circuit described above, wherein the converting circuit is adapted for converting a received digital signal into an analog signal, or converting a received analog signal into a digital signal.

Embodiments of the present disclosure have following advantages:

By using the control circuit to control the DAC, when the sample hold circuit receives an analog signal, the DAC can cooperate with the sample hold circuit and the comparator, and convert the analog signal into a digital signal. Moreover, after detecting a digital signal is input, the control circuit can control the DAC to convert the digital signal into an analog signal, and control the DAC to output the converted analog signal. Therefore, the converting circuit is capable of not only converting an analog signal into a digital signal, but also converting a digital signal into an analog signal, without increasing chip area of the control circuit. With application of the converting circuit, there is no need to set an additional DAC. Therefore, the chip area and chip cost are reduced.

DETAILED DESCRIPTION

Figure 1:
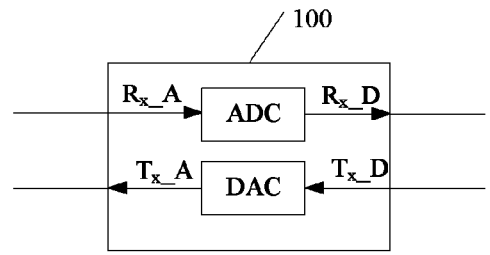
FIG. 1 illustrates a schematic structural diagram of a conventional communication device.

Referring to FIG. 1, an Analog to Digital Converter (ADC) is usually provided in a downlink of a conventional communication device 100. The ADC is used to convert a received analog signal $R_x\_A$ to a corresponding digital signal $R_x\_D$. For example, a control circuit is used to control the conversion of the signals. Correspondingly, a Digital to Analog Converter (DAC) is usually provided in an uplink. The DAC is used to convert a received digital signal $T_x\_D$ to an analog signal $T_x\_A$ and then output the analog signal $T_x\_A$. The ADC and the DAC are two individual circuits, which may increase chip area and chip cost.

In order to solve the above problems, a converting circuit is provided according to embodiments of the present disclosure. The converting circuit may include a control circuit, a DAC, a sample hold circuit and a comparator. Under control of the control circuit, the DAC not only can convert a received analog signal into a digital signal in coordination with the sample hold circuit, but also can convert a received digital signal into an analog signal. As a result, the converting circuit has both an analog to digital conversion function and a digital to analog conversion function, which will not increase chip area with the control circuit. Therefore, the chip area and chip cost are reduced in actual application, because an additional DAC is no longer needed.

In order to clarify the objects, characteristics and advantages of the disclosure, the embodiments of the present disclosure will be described in detail in conjunction with the accompanying drawings.

Figure 2:
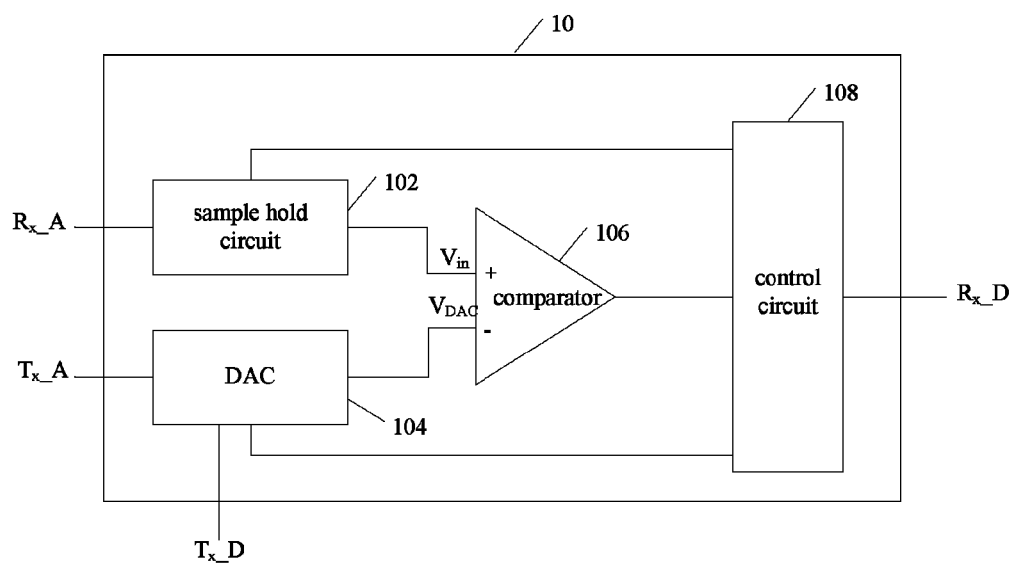
FIG. 2 illustrates a schematic structural diagram of a converting circuit according to one embodiment.

Referring to FIG. 2, a converting circuit 10 is provided according to one embodiment. The converting circuit 10 may include: a sample hold circuit 102 for receiving an analog signal $R_x\_A$; a DAC circuit 104; a comparator 106 being connected with an output end of the sample hold circuit 102 and an output end of the DAC 104; and a control circuit 108 being connected with an output end of the comparator 106.

When the control circuit 108 detects that the sample hold circuit 102 has received an analog signal $R_x\_A$, the control circuit 108 transmits corresponding control signals to the sample hold circuit 102 and the comparator 106, and controls the sample hold circuit 102 and comparator 106 to work. Simultaneously, the control circuit 108 also transmits a corresponding control signal to the DAC 104 for adjusting an output of the DAC 104, in order to obtain a corresponding digital signal $R_x\_D$. When the control circuit 108 detects that a digital signal $T_x\_D$ is input, the control circuit 108 controls the DAC 104 to convert the digital signal $T_x\_D$ to an analog signal, and output the analog signal.

An embodiment of the converting circuit 10 is described below to clarify its working principle. After receiving an analog signal $R_x\_A$, the sample hold circuit 102 samples the analog signal $R_x\_A$ to obtain discrete analog signals, and outputs the sampled signal (a voltage value $V_{in}$ of the discrete analog signal) under control of the control circuit 108. An initial voltage of the DAC 104 may be preset. The output voltage $V_{DAC}$ of the DAC 104 and the voltage $V_{in}$ of the discrete analog signal are input into the comparator 106. The comparator 106 compares $V_{DAC}$ and $V_{in}$ under control of the control circuit 108.

In some embodiments, when $V_{DAC}<V_{in}$, the comparator 106 may output a logic low level; and when $V_{DAC}>V_{in}$, the comparator 106 may output a logic high level. In other embodiments, when $V_{DAC}<V_{in}$, the comparator 106 may output a logic high level; and when $V_{DAC}>V_{in}$, the comparator 106 may output a logic low level. The output of the comparator 106 may be stored in the control circuit 108.

When the control circuit 108 detected the digital signal $T_x\_D$ is input, the analog signal $R_x\_A$ has been converted into the digital signal $R_x\_D$ and transmitted into a computer for processing. That is, under control of other devices of the communication system, the control circuit 108 either controls the converting circuit to convert the analog signal $R_x\_A$ to the digital signal $R_x\_D$, or controls the DAC 104 to convert the digital signal $T_x\_D$ to the analog signal $T_x\_A$ at a same time.

In some embodiments, the digital signal $T_x\_D$ may be input to the control circuit 108. After detecting the digital signal $T_x\_D$ is input, the control circuit 108 outputs the digital signal $T_x\_D$ to the DAC 104 and controls the DAC to convert the digital signal $T_x\_D$ to a corresponding analog signal $T_x\_A$. In other embodiments, the digital signal $T_x\_D$ may be input to the DAC 104 directly. After detecting the digital signal $T_x\_D$ is input, the control circuit 108 transmits a control signal to the DAC 104 and controls the DAC 104 to convert the digital signal $T_x\_D$ to a corresponding analog signal $T_x\_A$.

It should be noted that, the control unit 108 may transmit the corresponding control signal to the DAC 104 when the converting circuit 10 starts to receive the digital signal $T_x\_D$. The control unit 108 may also transmit the corresponding control signal to the DAC 104 after the converting circuit has received the digital signal $T_x\_D$.

Figure 3:
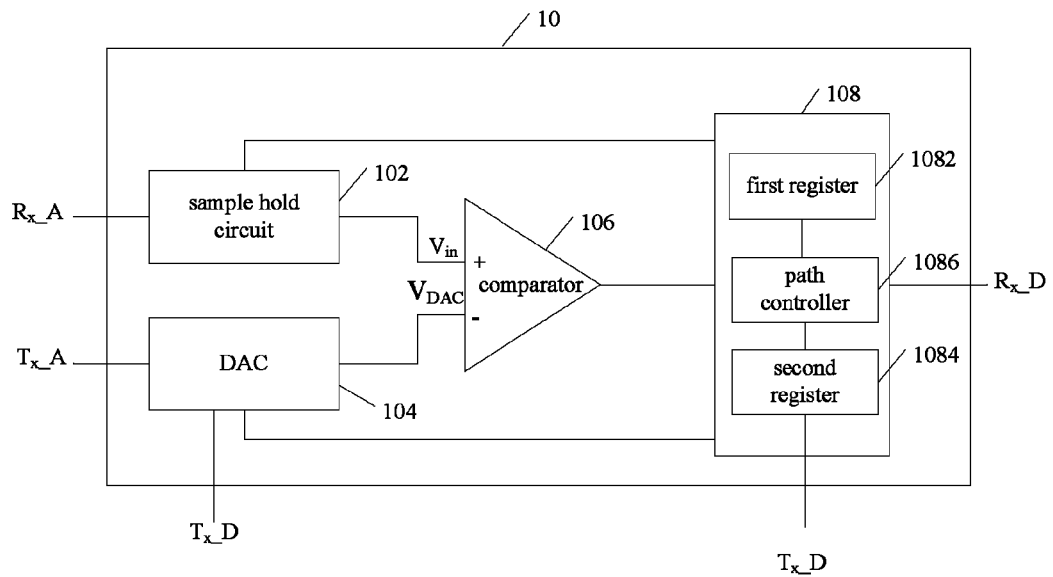
FIG. 3 illustrates a schematic structural diagram of a converting circuit according to another embodiment.

Referring to FIG. 3, a converting circuit 10 is provided according to another embodiment. A difference between this embodiment and the above embodiment lies in that the control circuit 108 of this embodiment includes: a first register 1082 for storing an output signal of the comparator 106, a second register 1084 for storing the digital signal, and a path controller 1086 for controlling the DAC 104 based on a value of the first register 1082 or a value of the second register 1084.

When the sample hold circuit 102 receives the analog signal $R_x\_A$, the path controller 1086 can determine that the converting circuit is used to convert an analog signal into a digital signal at the present time. Based on this, the path controller 1086 may transmit corresponding control signals to the sample hold circuit 102, the DAC 104 and the comparator 106, so as to control the sample hold circuit 102 to sample the received signal $R_x\_A$, control the comparator 106 to compare a voltage $V_{in}$ of the sampled signal with an output voltage $V_{DAC}$ of the DAC 104, and store an output of the comparator 106 in the first register 1082.

In some embodiments, when the comparator 106 compares the voltage $V_{in}$ of the sampled signal with the output voltage $V_{DAC}$ of the DAC 104, if $V_{DAC}<V_{in}$, the comparator 106 may output a logic low level (for example, 0); and if $V_{DAC}>V_{in}$, the comparator 106 may output a logic high level (for example, 1). In other embodiments, if $V_{DAC}<V_{in}$, the comparator 106 may output a logic high level (for example, 0), and if $V_{DAC}>V_{in}$, the comparator 106 may output a logic low level (for example, 1).

The path controller 1086 adjusts the output voltage $V_{DAC}$ of the DAC 104 according to the value of the first register 1082. For example, when a bit of the first register 1082 is zero, which means $V_{DAC}<V_{in}$ at the present time, the path controller 1086 may adjust the output voltage $V_{DAC}$ of the DAC 104 larger, in order to make $V_{DAC}$ approach $V_{in}$. If the adjusted $V_{DAC}$ is still smaller than $V_{in}$, the path controller 1086 may go on adjusting the output voltage $V_{DAC}$ of the DAC 104 larger until $V_{DAC}=V_{in}$.

In an implementation, the path controller 1086 may adjust the output voltage $V_{DAC}$ of the DAC 104 using a bisection method. That is, a reference voltage $V_{ref}$ is preset, and an initial value of the output voltage of the DAC 104 is set to $V_{ref}/2$. When $V_{DAC}<V_{in}$, the path controller 1086 adjusts $V_{DAC}$ to make $V_{DAC}=(V_{ref}+V_{ref}/2)/2$. If $(V_{ref}+V_{ref}/2)/2$ is still smaller than $V_{in}$, the path controller 1086 may go on adjusting $V_{DAC}$ to make $V_{DAC}=(V_{ref}+(V_{ref}+V_{ref}/2)/2)/2$, and so on, until $V_{DAC}=V_{in}$.

It should be noted that, the path controller 1086 may use other methods to adjust the output voltage $V_{DAC}$ of the DAC 104. It is not limited herein.

In an implementation, the second register 1084 is used to store the digital signal $T_x\_D$. Namely, after receiving the digital signal $T_x\_D$, the second register 1084 may store the digital signal $T_x\_D$ therein. When the path controller 1086 detects the digital signal $T_x\_D$ to be converted is stored in the second register, the path controller 1086 outputs the digital signal $T_x\_D$ to the DAC 104 according to a value of the digital signal $T_x\_D$, and controls the DAC 104 to convert the digital signal $T_x\_D$ to obtain an analog signal $T_x\_A$ corresponding to the digital signal $T_x\_D$. The analog signal $T_x\_A$ is output by the DAC 104. That is, the received digital signal $T_x\_D$ is converted to a transmittable analog signal $T_x\_A$ and is transmitted.

Figure 4:
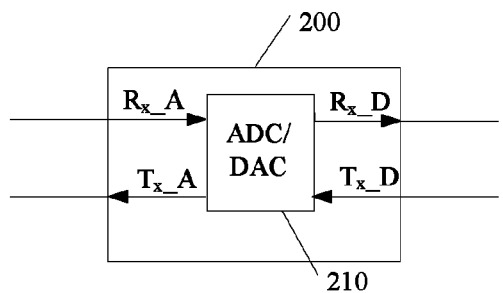
FIG. 4 illustrates a schematic structural diagram of a communication device according to one embodiment of the present disclosure.

Referring to FIG. 4, a communication device 200 is provided according to one embodiment. The communication device 200 includes a converting circuit 210 of above embodiments.

By adopting the converting circuit 210 of above embodiments in a communication device, when an analog signal $R_x\_A$ is received, the converting circuit 210 converts the analog signal $R_x\_A$ to a corresponding digital signal $R_x\_D$; and when a digital signal $T_x\_D$ is received, the converting circuit 210 converts the digital signal $T_x\_D$ to a corresponding analog signal $T_x\_A$ and transmit the analog signal $T_x\_A$. Namely, the converting circuit 210 not only can convert a received digital signal into an analog signal, but also can convert a received analog signal into a digital signal, so that cost of the communication device 200 can be reduced effectively.

From above, it can be seen that, there is no need to configure an additional DAC in the uplink of the communication system if the converting circuit 210 of above embodiments are used. The converting circuit 210 has not only an ADC function but also a DAC function, so that chip area of the converting circuit can be reduced effectively.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A converting circuit, comprising:
a sample hold circuit for receiving an analog signal;
a Digital to Analog Converter (DAC);
a comparator being connected with an output end of the sample hold circuit and an output end of the DAC; and
a control circuit being connected with an output end of the comparator,
wherein when the sample hold circuit receives an analog signal, the control circuit controls the sample hold circuit and the comparator to work, controls an output of the DAC based on an output of the comparator, and outputs a corresponding digital signal; and when the control circuit detects a digital signal is input, the control circuit controls the DAC to convert the digital signal into a corresponding analog signal and output the corresponding analog signal; and
wherein the control circuit comprises: a first register for storing an output signal of the comparator; a second register for storing the digital signal; and a path controller for controlling the DAC based on a value of the first register or a value of the second register.

2. The circuit according to claim 1, wherein the path controller adjusts a value of an output voltage of the DAC based on the value of the first register, so that the output voltage of the DAC successively approximates an output of the sample hold circuit.

3. The circuit according to claim 2, wherein the path controller uses a bisection method to adjust the value of the output voltage of the DAC.

4. The circuit according to claim 1, wherein the first register and the second register have the same storable bits.

5. The circuit according to claim 1, wherein the path controller controls the DAC to convert the digital signal based on the value of the second register, and the DAC outputs the converted signal.

6. The circuit according to claim 1, wherein under control of the control circuit, the sample hold circuit samples the input analog signal, and outputs a voltage value of the sampled analog signal.

7. The circuit according to claim 6, wherein under control of the control circuit, the comparator compares the voltage value of the sampled signal output by the sample hold circuit, with the output voltage value output by the DAC.

8. The circuit according to claim 7, wherein when the output voltage value of the DAC is less than the voltage value of the sampled signal, the comparator outputs a logic low level; and when the output voltage value of the DAC is greater than the voltage value of the sampled signal, the comparator outputs a logic high level.

9. A communication device, comprising: a converting circuit adapted for converting a received digital signal into an analog signal, or converting a received analog signal into a digital signal,
wherein the converting circuit comprises:
a sample hold circuit for receiving an analog signal;
a Digital to Analog Converter (DAC);
a comparator being connected with an output end of the sample hold circuit and an output end of the DAC; and
a control circuit being connected with an output end of the comparator,
wherein when the sample hold circuit receives an analog signal, the control circuit controls the sample hold circuit and the comparator to work, controls an output of the DAC based on an output of the comparator, and outputs a corresponding digital signal; and when the control circuit detects a digital signal is input, the control circuit controls the DAC to convert the digital signal into a corresponding analog signal and output the corresponding analog signal; and
wherein the control circuit comprises: a first register for storing an output signal of the comparator; a second register for storing the digital signal; and a path controller for controlling the DAC based on a value of the first register or a value of the second register.

10. The device according to claim 9, wherein the path controller adjusts a value of an output voltage of the DAC based on the value of the first register, so that the output voltage of the DAC successively approximates an output of the sample hold circuit.

11. The device according to claim 10, wherein the path controller uses a bisection method to adjust the value of the output voltage of the DAC.

12. The device according to claim 9, wherein the first register and the second register have the same storable bits.

13. The device according to claim 9, wherein the path controller controls the DAC to convert the digital signal based on the value of the second register, and the DAC outputs the converted signal.

14. The device according to claim 9, wherein under control of the control circuit, the sample hold circuit samples the input analog signal, and outputs a voltage value of the sampled analog signal.

15. The device according to claim 14, wherein under control of the control circuit, the comparator compares the voltage value of the sampled signal output by the sample hold circuit, with the output voltage value output by the DAC.

16. The device according to claim 15, wherein when the output voltage value of the DAC is less than the voltage value of the sampled signal, the comparator outputs a logic low level; and when the output voltage value of the DAC is greater than the voltage value of the sampled signal, the comparator outputs a logic high level.

* * * * *